(12) United States Patent
Rousu et al.

(10) Patent No.: US 8,086,185 B2
(45) Date of Patent: Dec. 27, 2011

(54) QUALIFY METHOD FOR SHIELDING OF TRANSCEIVER RF BLOCK

(75) Inventors: Seppo Olavi Rousu, Oulu (FI); Marko Eero Tapani Leinonen, Bangalore (IN); Juha Pentti Tapio Valtanen, Oulu (FI)

(73) Assignee: Nokia Corporation, Espoo (FI)

( * ) Notice: Subject to any disclaimer, the term of this patent is extended or adjusted under 35 U.S.C. 154(b) by 1019 days.

(21) Appl. No.: 11/986,439

(22) Filed: Nov. 21, 2007

(65) Prior Publication Data

US 2009/0130989 A1    May 21, 2009

(51) Int. Cl.
*H04W 88/02* (2009.01)
(52) U.S. Cl. .................................................. 455/67.11
(58) Field of Classification Search ............... 455/67.11, 455/115.1, 101, 567, 575.5, 73, 452.2, 452.3; 285/401
See application file for complete search history.

(56) References Cited

U.S. PATENT DOCUMENTS

| 4,962,358 | A | 10/1990 | Svetanoff | 324/627 |
| 5,534,772 | A | 7/1996 | Rogers | 324/72.5 |
| 5,631,572 | A | 5/1997 | Sheen et al. | 324/754 |
| 5,828,220 | A | 10/1998 | Carney et al. | 324/627 |
| 6,178,310 | B1* | 1/2001 | Jeong | 455/67.11 |
| 6,625,428 | B1* | 9/2003 | Finnell et al. | 455/115.1 |
| 6,886,867 | B1* | 5/2005 | Sutton et al. | 285/401 |
| 7,687,858 | B2* | 3/2010 | Woo et al. | 257/355 |
| 2002/0050861 | A1* | 5/2002 | Nguyen et al. | 330/254 |
| 2010/0022279 | A1* | 1/2010 | Hoberg et al. | 455/567 |
| 2010/0093289 | A1* | 4/2010 | Nash et al. | 455/101 |

* cited by examiner

*Primary Examiner* — Diane Mizrahi
(74) *Attorney, Agent, or Firm* — Harrington & Smith

(57) ABSTRACT

A method is provided for inputting a signal that is modulated at a predetermined frequency to a receiver signal path of a radio subsystem and demodulating the signal at the predetermined frequency as it passes through the receiver signal path, measuring signal quality of the demodulated signal, and quantitatively assessing shielding of the radio subsystem with the measured signal.

25 Claims, 10 Drawing Sheets

QUALIFY METHOD FOR SHIELDING OF TRANSCEIVER RF BLOCK

TECHNICAL FIELD

The teachings in accordance with the exemplary embodiments of this invention relate generally to a use of RF components, circuits and antennas and more specifically relate to RF testing to qualify shielding efficiency.

BACKGROUND

Certain abbreviations that may be found in the description and/or in the Figures are herewith defined as follows:
ADC analog to digital converter
BB base band
BER bit error rate
BLER block error rate
CDMA code division multiple access
DAC digital to analog converter
DVB-H digital video broadcasting-handheld
EMC electromagnetic compatibility
EVM error vector magnitude
FDD frequency domain division
FEM front end module
FM frequency modulation
GPS global positioning system
GSM global system for mobile communication
HB high band
IF intermediate frequency
IQ in phase/quadrature phase
ISM industrial scientific and medical
LB low band
LNA low noise amplifier
LPF low pass filter
LTE long term evolution of UTRAN (E-UTRAN)
PA power amplifier
PWB printed wired board
RF radio frequency
RFIC radio frequency integrated circuit
RFID radio frequency identification
RMS root mean square
RX receiver or received
SIR signal to interference ratio
SMD surface mounting device
SNR signal to noise ratio
TDD time domain division
TX transmitter or transmitted
UWB ultrawide band
UE user equipment
VCO voltage control oscillator
VSWR voltage standing wave ratio
WCDMA wideband code division multiple access
WiMax worldwide interoperability for microwave access
WLAN wireless local area network
WWAN wireless wide area network Typical communication devices such as mobile phones currently can have several radio systems integrated into a single device. The typical device may support multiple bands including multiple standards for different cellular systems such as for example GSM, CDMA, and WCDMA as well as several complementary wireless systems. Further, a complementary wireless system can be for example WLAN, UWB, Bluetooth, GPS, DVB-H, FM reception/transmission, RFID, Flarion, WiMax and/or Galileo.

Since an increasing number of radio systems are being integrated into devices it can be seen that the number of interference sources are also increasing. For example, when a first communication device is operating at a first frequency and a second communication device is operating at a second frequency, then it is still possible that both communication devices will be interfering with each other. Alternatively in the case where the first communication device can operate at two frequency bands such as with one dedicated band for reception and a second dedicated band for transmission, the devices own transmission may interfere with its own reception.

The interference discussed previously may travel from a first radio to second radio over the air for example from a first antenna to a second antenna. Radiated power from antenna can couple to other block(s) on a PWB In addition, interference coupling can occur in a reverse direction from a radiating block to an antenna and/or from an antenna to any other block in the device. Alternatively the interference can be introduced within the transceiver implementation if any interference power at any frequency is leaked to unwanted block within the transceiver. In order to prevent this unwanted signal leak a dedicated shielding has been used in radio implementations. A shield acts like a Faraday gage, which prevents an unwanted signal radiation out or coming inside the shield.

Embodiments of this invention improve interference and signal quality testing over at least the above regimen, particularly in shielding aspects.

SUMMARY

In an exemplary aspect of the invention, there is a method, comprising inputting a signal that is modulated at a predetermined frequency to a receiver signal path of a radio subsystem, demodulating the signal at the predetermined frequency as it passes through the receiver signal path, measuring signal quality of the demodulated signal, and quantitatively assessing shielding of the radio subsystem with the measured signal.

In another exemplary aspect of the invention, there is a computer readable medium encoded with a computer program executable by a processor to perform actions comprising inputting a signal that is modulated at a predetermined frequency to a receiver signal path of a radio subsystem, demodulating the signal at the predetermined frequency as it passes through the receiver signal path, measuring signal quality of the demodulated signal, and quantitatively assessing shielding of the radio subsystem with the measured signal quality.

In still another exemplary aspect of the invention, there is an apparatus, comprising a transmitter, an oscillator coupled to the transmitter configurable to input a signal that is modulated at a predetermined frequency to a receiver signal path of a radio subsystem, configurable to demodulate the signal at the predetermined frequency as it passes through the receiver signal path, a digital signal generation block configurable to measure signal quality of the demodulated signal, and the digital signal generation block further configurable to quantitatively assess shielding of the radio subsystem with the measured signal.

BRIEF DESCRIPTION OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
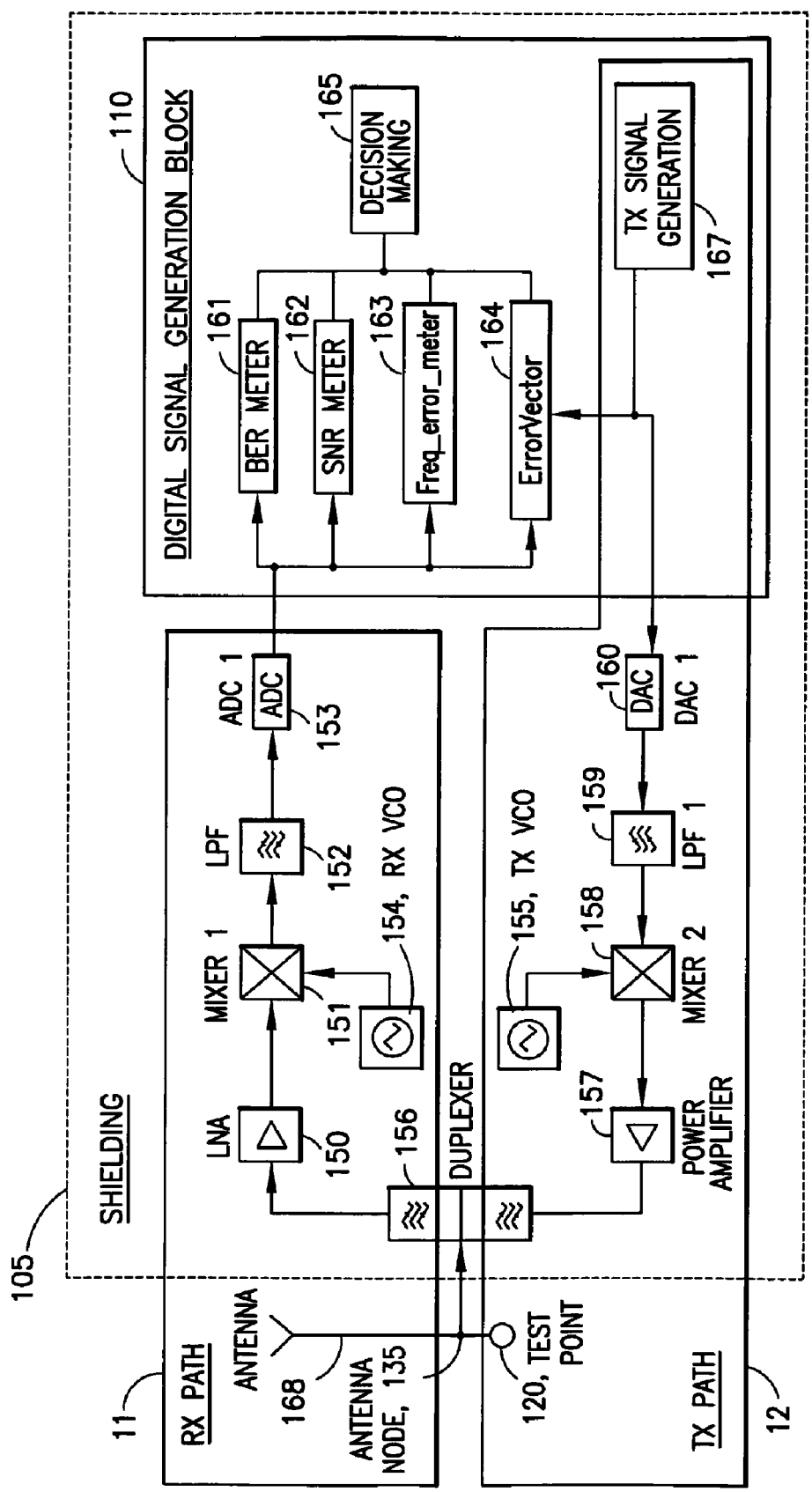
FIG. 1 illustrates an FDD transmitter and receiver according to an exemplary embodiment of the invention.

A non-limiting exemplary embodiment of the invention describes a method and apparatus for testing of an RF shielding in a radio frequency communication device. As disclosed herein an exemplary embodiment of the invention relates to a dynamic operational condition affecting radio frequency (RF) circuitry. Such a dynamic operational condition problem can be seen to result from, for example, when a user places his or her hand on top of a antenna of a radio frequency communication device. This action alters an antenna voltage standing wave ratio (VSWR), which affects an amount of radiated interference of active RF circuitry being used in RF operation(s).

In another exemplary embodiment of the invention described herein is a method and apparatus to test a radio frequency communication device to determine if an RF electromagnetic compatibility shielding is correctly placed. Such that if the shielding is not assembled properly for example then a resulting interference signal may have an adverse effect on an operation of a device such as a radio component or a radio subsystem. Such a subsystem can be a radio receiver in which reception performance can be degraded by an interference signal. Alternatively according to a non-limiting exemplary embodiment of the invention a radio subsystem can be a radio transmitter in which transmission signal quality can be degraded by an interference signal, a radio subsystem can be a radio frequency synthesizer in which local signal quality can be degraded by an interference signal, a radio subsystem can be a radio transceiver in which an air-interface performance can be degraded by an interference signal, and as a further non-limiting embodiment a radio subsystem can be a combination of a radio transmitter, a radio receiver, a radio frequency synthesizer or a radio transceiver.

In accordance with a method and apparatus described herein a shielding efficiency of a radio subsystem is determined by considering a combination of a shielding provided for a radio sub-system itself and a shielding provided for an interference source. A shielding efficiency provides attenuation for an interference signal from a interference source to a radio subsystem. According to an exemplary embodiment of the invention a needed attenuation against an external interference or a needed shielding efficiency can be determined so that a radio transceiver performance is not degraded due to an interference signal that is present. An interference source can be at least one of a transmitter, a receiver, a frequency synthesizer, a memory block, a digital signal path, a analog signal path, a display, a microphone, a camera, a flash light for a camera, a charger, a electromechanical part of a device, or an alternative radio subsystem.

An exemplary embodiment of the invention described can be implemented while sharing the same local oscillator signal such as a voltage control oscillator (VCO) signal, for a terminal transmitter and a receiver. In a further non-limiting exemplary embodiment of the invention there can be used in a device, for example a radio frequency communication device, a method and/or apparatus to detect a predetermined signal quality, for example a raw BER, BER, BLER, EVM, and/or phase error, of the device's own transmission. In still another exemplary embodiment of the invention the detected predetermined signal is compared to a predetermined threshold value. As a further non-limiting exemplary embodiment of the invention a method-and apparatus according to the invention can be used in any RF architecture and as a non-limiting example can be used in superheterodyne, direct conversion or polar loop architectures. Further, it is noted the exemplary embodiments of the invention can be applied to and can pertain to any transceiver, transmitter, or receiver including but not limited to a GSM transceiver, transmitter, and/or receiver.

In a non-limiting exemplary embodiment of the invention there is a stand alone shielding qualification test method for production, customer service centers, and for during the normal operation of the radio frequency communication device. In another exemplary embodiment of the invention there is a method and/or apparatus to measure how well the shielding of the transceiver protects the transmitter and receiver from interference wherein the interference is generated within the terminal itself.

As described herein it is understood that there can be radiated power from a fundamental frequency of transmission or from any harmonic of a transmission that leaks back to and interferes with any other radio component. For example if fundamental transmission interference is leaking to a TX VCO then as a result the TX VCO local oscillator signal quality is decreased. This can be seen as a TX VCO frequency drifting and cause a phase error or an error vector magnitude increase of the transmission. Further, when a VCO is running at two times fundamental frequency and TX $2^{nd}$ harmonic frequency interference is leaking to a TX VCO then as a result the TX VCO local oscillator signal quality is decreased Further in accordance with an exemplary embodiment of the invention a VCO operational frequency may be altered during the operation of the device. As an example FIG. 1 illustrates that a transmitter and receiver have their own VCOs for local oscillator signal generation. In FIG. 1 both the VCOs may operate at the same frequency during the actual transmission or reception of a signal. In an alternative non-limiting exemplary embodiment of the invention the VCOs can be operating at multiple transmission or reception frequencies. In still another exemplary embodiment the VCO is operating at a divisible frequency of the transmission or reception frequency.

In accordance with another non-limiting exemplary embodiment of the invention a qualification test method is performed on a transceiver comprising a transmitter and receiver such that the transmitter (TX) and receiver (RX) of the transceiver are functioning simultaneously. In an alternative embodiment if the transmitter and receiver are sharing the same local oscillator signal and there is interference caused by the transmission leaking to the VCO circuitry, then in this case the receiver reception performance is decreased. Further, it is noted that if the transmitter and receiver are sharing the same local oscillator signal and there is interference caused by the transmission leaking to the VCO circuitry, then in this case the transmitter performance is decreased.

In accordance with an exemplary embodiment of the invention transmitter output power levels are aligned to design targets and operational power levels may be altered during the operation of the device. In one aspect of the method and apparatus described herein it is known that a terminal such as a mobile terminal is more vulnerable to interference when operating at the highest power levels. Thus, in an alternative exemplary embodiment of the invention a transmitter power can be increased incrementally until interference can be detected. In addition, the power levels can be recorded when no interference is present as well as when interference occurs. Further, according to another exemplary embodiment of the invention the testing can be started with a highest available power of a terminal and incrementally lowered to determine when interference occurs. If interference occurs, then the power levels can be reduced until the interference disappears, and this level can subsequently be recorded. Using this technique for example test engine robustness for determining results such as from interference versus power levels can be recorded for further testing and improvements.

In FIG. 1 there is illustrated a non-limiting exemplary embodiment of the invention wherein a means for TX signal generation is shown as but not limited to a digital signal generation block 110. The digital signal generation block 110 is an exemplary embodiment of the invention and contains information for both in-phase (I) and quadrature (Q) signals. Further, although not illustrated in FIG. 1, for clarity it is noted that the TX and RX signal paths illustrated comprise both I and Q signaling. In addition, shielding 105 indicating shielding in a device, for example a radio frequency communication device, is illustrated by a dotted line between the antenna and around the device. It is noted that according to the exemplary embodiments of the invention the digital signal generation block 110 comprises mechanisms for measuring signals from both the TX and RX signal paths. Furthermore, according to an exemplary embodiment of the invention the digital signal generation block 110 can detect and interpret a received signal.

In addition, in FIG. 1 the test point 120 can be a test connector which can be used for at least production testing purposes. Alternatively the test point 120 can be a external connector which can be used to attach the device to external devices such as, for example, external testing. Further, according to an exemplary embodiment of the invention this test point 120 can be an antenna connector for an external antenna to enhance a transmission and reception capability of the device. With test point 120 the transceiver can be measured conductively. In addition, the test point 120 can be used with or without an antenna. Further, from test point 120 a receiver and a transmitter can be measured separately. It is noted that this kind of measurement gives an absolute performance indication of the transceiver and/or receiver when an external tester is used for testing. In addition, a receiver (RX) path 11 and a transmitter (TX) path 12 are illustrated in FIG. 1 to show an example of signal paths according to a non-limiting exemplary embodiment of the invention. It is noted that in an embodiment of the invention it can be that if an RX and TX of the device are operating in the same time slot then a signal can be configurable to pass from the TX path 12 to the RX path 11 via the antenna node 135. In addition a TX signal can pass to RX path also due to inadequate isolation of components of the device, such as filters, switches or a PWB.

It can be seen in FIG. 1, as a non-limiting embodiment of the invention, there is illustrated in the RX path 11 of FIG. 1 LNA 150, mixer1 151, LPF 152, ADC1 153, duplexer 156, RX VCO 154, and antenna 168. Further, in a non-limiting embodiment of the invention as illustrated in a TX path 12 of FIG. 1 there is duplexer 156, power amplifier 157, tx vco 155, mixer2 158, LPF1 159, DAC1 160, and TX signal generation 167. In addition, in a digital signal generation block 110 of FIG. 1 there is BER meter 161, SNR meter 162, frequency_error_meter 163, error vector unit 164, and decision making unit 165. It is also noted that test point 120 in FIG. 1 may be associated or not with either the RX path 11 or the TX path 12. The test point 120 may be also associated as antenna feeding galvanic contacts or antenna connector, which can be used to connect an external antenna with a cable to the RF module.

As illustrated in FIG. 1 within the digital signal generation block 110 and in accordance with an exemplary embodiment of the invention there is an SNR meter block 162. The SNR meter 162 can measure and identify a signal to noise ratio and a signal to interference ratio and identify a noise type. The noise measured can be either a wide band noise when the SNR meter 162 is measuring a signal to noise ratio or the noise measured can be interference when the SNR meter 162 is measuring a signal to interference ratio.

The blocks 161, 162, 163, 164 and 165 are shown in FIG. 1 as a functional block. In accordance with an exemplary embodiments of the invention the actual implementation of these functional blocks can be accomplished using a hardware implementation or a software implementation or a combination of both.

Further, it is noted that the receiver (RX) path 11 and the transmitter (TX) path 12 are not limited for illustrative purposes to FIG. 1 but may apply to all relevant Figures as described herein. Further, it is noted that the receiver path 11 and the transmitter path 12 do not have to be embodied on the same device in accordance with an exemplary embodiment of the invention. Further, it is noted that the receiver path 11 and the transmitter path 12 do not have to be embodied on the same radio subsystem in accordance with an exemplary embodiment of the invention. It is also noted that the receiver (RX) path 11 and a transmitter (TX) path 12 as illustrated may comprise less or more components than illustrated and may relate to any type of radio frequency communication device in accordance with the exemplary embodiments of the invention. It is noted that a receiver path and a transmitter path can have their own antennas. It is also noted that a receiver and a transmitter path may have separate antennas while at the same time the receiver and the transmitter may still share a common antenna.

According to the embodiments of the invention the transmitter is configurable to transmit a signal in a discontinuous manner or as transmission slots, where the transmitted signal comprises I/Q baseband signals and the signals are further configurable to use selected bit sequences that are optimal for analysis in accordance with an exemplary embodiment of the invention. In another exemplary embodiment of the invention I/Q baseband signals may be pre-distorted such that detection sensitivity for external leakage can be enhanced and/or adjusted. In still another exemplary embodiment of the invention the transmission signal is transmitted continuously and reception is active at the same time. Further, the signal is transmitted and received at a predefined output power at a predefined reference point.

Further, in accordance with an embodiment of the invention a generated TX signal is amplified by a power amplifier and then sent to an antenna node which as an example can also be an antenna radiator or an antenna connector.

According to a non-limiting exemplary embodiment of the invention a determination result can be configurable using a threshold limit indicating, as an example, a PASS or FAIL status. The decision can use, for example, information determined from a received signal at a receiver was and the signal transmitted and/or generated by the transmitter. Further, in accordance with a non-limiting exemplary embodiment of the invention there are configurable threshold limits including limits for RMS phase error PASS/FAIL decision for example wherein normally a working transceiver RMS Phase error values are LB less than 1%, HB less than 2%, and a spec limit is 5.0%. When a predistortion is used such that detection sensitivity for external leakage adjusted, then threshold limits can be configured according the adjusted signal characteristics. A decision making unit can extract from a received signal characteristics which are part of signal degradation originated by the pre-distortion and which are part of signal degradation which is impacted by an interference signal.

In a non-limiting embodiment of the invention if a mechanical shielding such as for example a lid of an openable shield can or a gasket placed between mechanical parts is properly in place and as such no interference is presented to an interference sensitive radio block, for example, then an RMS phase error increase in the receiver can be determined as minor according to a configurable threshold limit. However, if interference is presented to the VCO then according to a configurable threshold limit it can be determined, for example, that the receiver is impacted. Further, in accordance with an embodiment of the invention the impact indicated can be determined and indicated to be due to an error such as for example a phase error increase as a function of coupling power to some block of a radio module. Further, according to an exemplary embodiment of the invention the interference can be determined as due to a coupling of any block within a device.

In accordance with the embodiments of the invention a qualification method for RF shielding can be, but is not limited to, raw BER, BER, BLER, Error vector magnitude between received and transmitted signals, and a computed phase error of received symbols that can be based on received I/Q signals.

Further, as a non-limiting exemplary embodiment of the invention a qualification can be done in combination with the above described exemplary embodiments of the invention. It is noted that a selftest result may not be precisely equal when measured with an external RF tester since the external RF tester can have a more dynamic operational range and a more ideal local oscillator generation for down conversion.

In accordance with an embodiment of the invention a VCO is configurable to settle to an alternate frequency in less than 200 μsec and then in every 2nd slot (577 μsec), thus an alternate TX channels may be tested within a short time period. Further, it is noted that a frequency interfering signal has an effect such that interference is introduced to the VCO signal purity. For example a VCO signal can have an unwanted phase shift or phase noise characteristics if the VCO system is presented with interfering RF power such as, for example, a 2nd harmonic. In addition, it is noted that a VCO output signal phase is configurable to be a sum of a phase of a coupling interfering RF signal and an original VCO signal phase. In a non-limiting exemplary embodiment of the invention the VCO signal can be distorted such as with a configurable phase rotation block in order to make a receiver more sensitive so as to detect if an interference signal is leaking inside of a shield.

Further, it is noted that test accuracy in accordance with the invention can be enhanced with production testing. In an exemplary embodiment of the invention production testing for determination of a phase error is accomplished using a phase error test, for example measuring RMS, or a galvanic measurement from a PWB. Further, in an exemplary embodiment of the invention an external tester measured phase error value can be stored to a terminal memory. In addition, in production testing a phase error self test is configurable to be done 1:1 and the results stored to a memory. Thus, according to an embodiment of the invention both phase error test results can be utilized concurrently in a decision or qualification and/or the results stored in memory can be utilized later.

In another non-limiting exemplary embodiment of the invention a decision is configurable to be made based on one or more channel measurement results from a frequency band. As a further non-limiting embodiment of the invention a test is configurable to be performed at all frequency bands if needed. In an another non-limiting exemplary embodiment of the invention a test is configurable to be performed at a frequency combination set which may not be normally operational in a specific type of communication system. For example wherein a GSM transmitter would have a frequency of 1800 MHz and a GSM receiver would have a frequency of 1900 MHz, testing according to an exemplary embodiment of the invention can be performed, for example, at a frequency range where these bands overlap each other. Further, in accordance with an exemplary embodiment of the invention a test is configurable to be performed in an out of band frequency.

Figure 2:
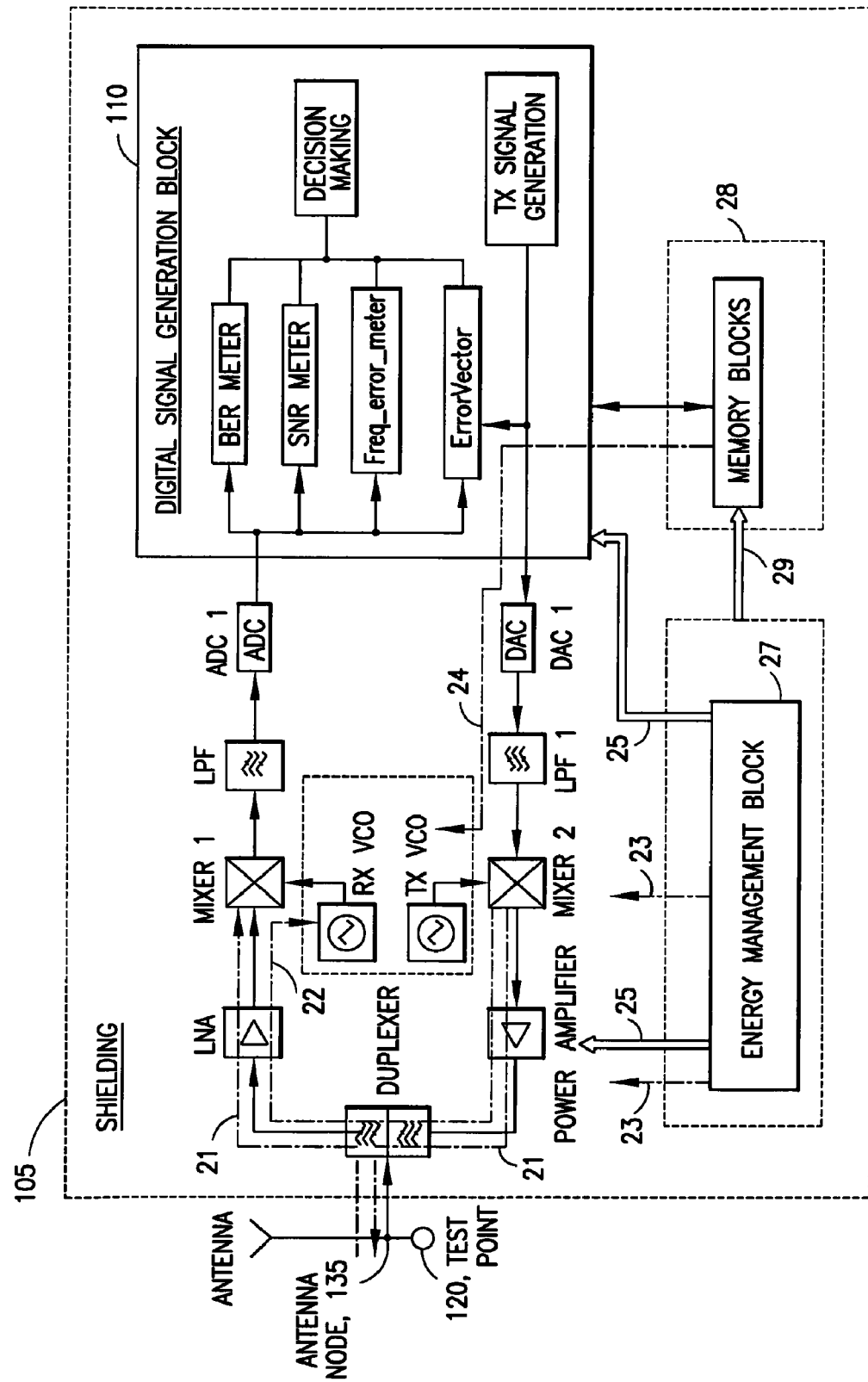
FIG. 2 illustrates interference generation possibilities of a transmitter and receiver according to an exemplary embodiment of the invention.

In FIG. 2 there are illustrated lines 25 which represent operational voltages made by an energy management block 27. This energy management block comprises a voltage generation, a voltage stabilization of generated voltages or battery voltage, and an operational voltage controlling of individual circuitries. It is noted that a separate shielding 29 is shown for the energy management block 27. In an Alternative embodiment the energy management block 27 is not separately shielded. As illustrated with line 23 of FIG. 2 interference can occur at the energy management circuitry due to poor shielding. Further, it is noted that said interference in the energy management circuitry can be distributed via radiation to any other circuitry. This also can be the case that the interference can propagate in a conductive manner to all other circuitries where operational voltage is provided by the energy management block. In addition, line 21 of FIG. 2 represents interference which can occur from an antenna to a receiver circuitry due to poor shielding.

In FIG. 2, line 22 represents interference which is coupled from a transmitter to the synthesizer circuitry due to poor shielding. An interfered synthesizer block can be used for a receiver or a transmitter or both. There may be separate shielding for Tx and Rx synthesizers and for other circuits and alternatively circuits may share a one shielding. It is noted that in accordance with the embodiments of the invention memory blocks 28 can be but are not limited to RAM, ROM or removable memory cards. These memory types operate with high frequency digital interfaces which may generate harmonic interference frequencies to the transceivers. As an non limiting example a memory device may have its own antenna for communication with an external device. During the communication a memory card/or other device communication signal may interference to other circuits. Further, this interference path is illustrated in FIG. 2 with line 24. The interference can propagate via radiation or alternatively the interference can propagate in a conductive manner. Additionally, radiated interference can be seen to be due to poor shielding. In accordance with the embodiments of the invention harmonic interference can be seen as blocked channels or degraded performance channels as an output of the receiver. Further in accordance with the embodiments of the invention these interferences can be measured with a signal quality measurement device such as a BER block, an error vector meter or an SNR meter block.

In accordance with a non-limiting embodiment of the invention there can be determined from a method in accordance with an embodiment of the invention, for example, wherein one or more blocks of a circuit it is necessary to shield separately with a dedicated shielding. In addition, there can be determined, for example, where one or more blocks of a transmitter need be shielded separately with a dedicated shielding. Further, a separate shielding can be determined to be needed due to a layout of the transceiver if an interference signal is seen to pass to any transceiver block and thus degrade a performance of the transceiver. In another example, it can be determined if a dedicated shielding is required by the transmitter, for example, if an interference or a radio communication signal passes to a power amplification circuitry and thus generates unwanted intermodulation frequencies to a transmission signal. Similarly it can be determined that a dedicated shielding may be needed for a receiver block if an interference signal is determined to pass to the receiver block. As a further non-limiting example an interference signal may be determined to generate an unwanted inter-modulation result with received signals or with a local oscillator signal and thus degrade a performance of the receiver or a performance of the synthesizer.

In accordance with an exemplary embodiment of the invention a shielding can be implemented using various methods as described herein. A shielding can be implemented, for example, with a dedicated metal can. The shielding metal can may be a solder-able to a PWB and have an open able lid for easier access and repair work. Further, shielding can be implemented with a mechanical structure which generates a substantial Faraday gage for a frequency of an interference. In addition, a mechanical structure can have a gasket between any mechanical parts to improve the shielding efficiency by making the shielding structure more conductive. Further, in accordance with the exemplary embodiments of the invention a gasket's conductivity can be improved by adding small conductive particles to the gasket material, like copper balls, silver/gold coated glass balls, springs or the like. Alternatively a shielding can be accomplished with a mechanical structure which is coated with a conductive material. Furthermore, shielding can be accomplished for structures which are embedded inside of a PWB itself by applying grounding connections around any active electrical circuitry. It is noted that the distance between grounding connections is frequency dependent but as a rule of thumb the distance between grounding connection should be less than a one tenth of the wave length of a signal. Further, in accordance with an embodiment of the invention modules can be shielded with a suitable material which is grounded via module PWB ground to PWB common ground. As a non-limiting example a module grounding element can be a PWB via, a PWB microvia, a conducting glue, or a bonding wire.

Figures 3, 3A:
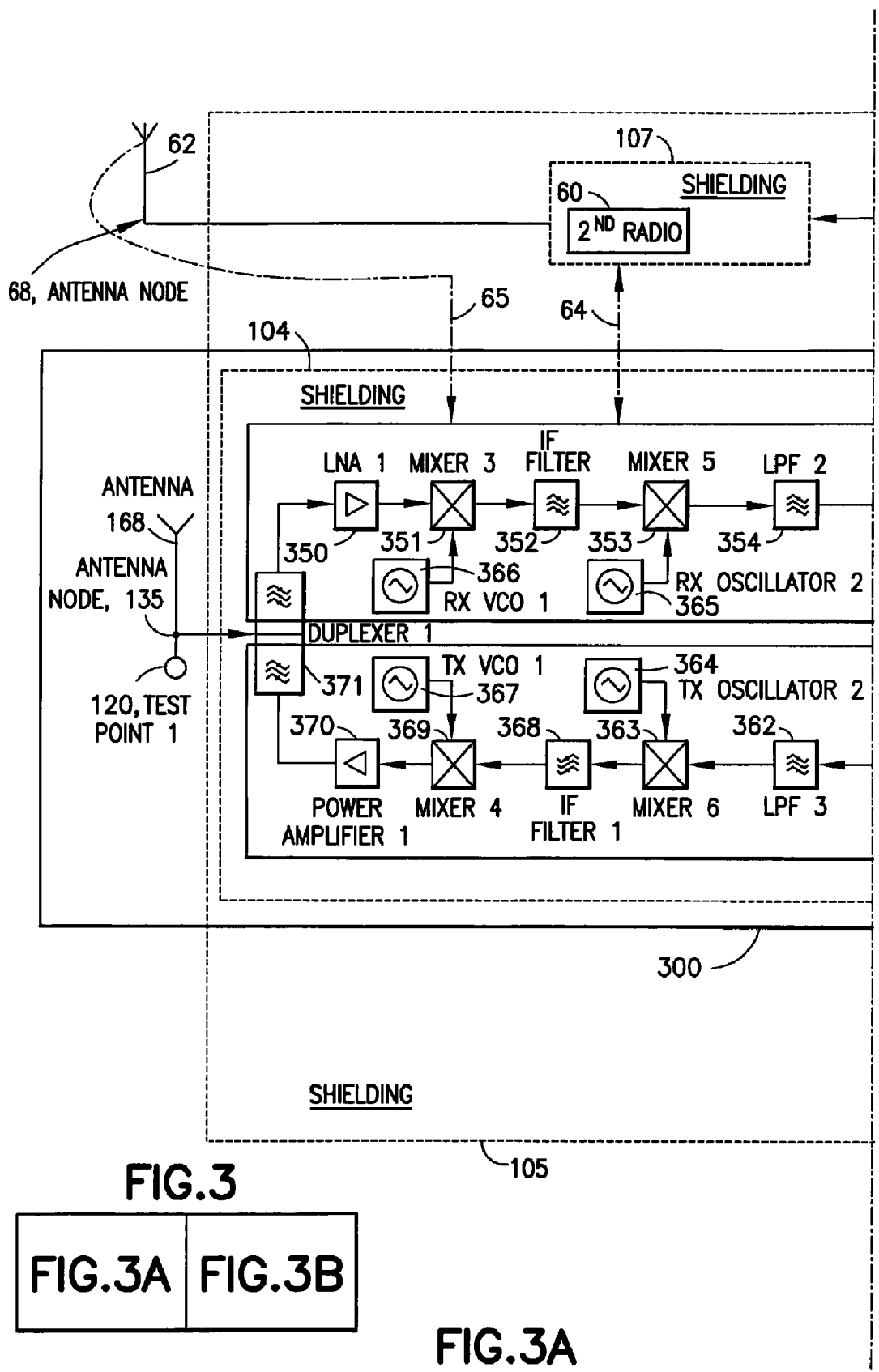
FIG. 3 illustrates an FDD superheterodyne transmitter and receiver according to an exemplary embodiment of the invention.
Figure 3B:
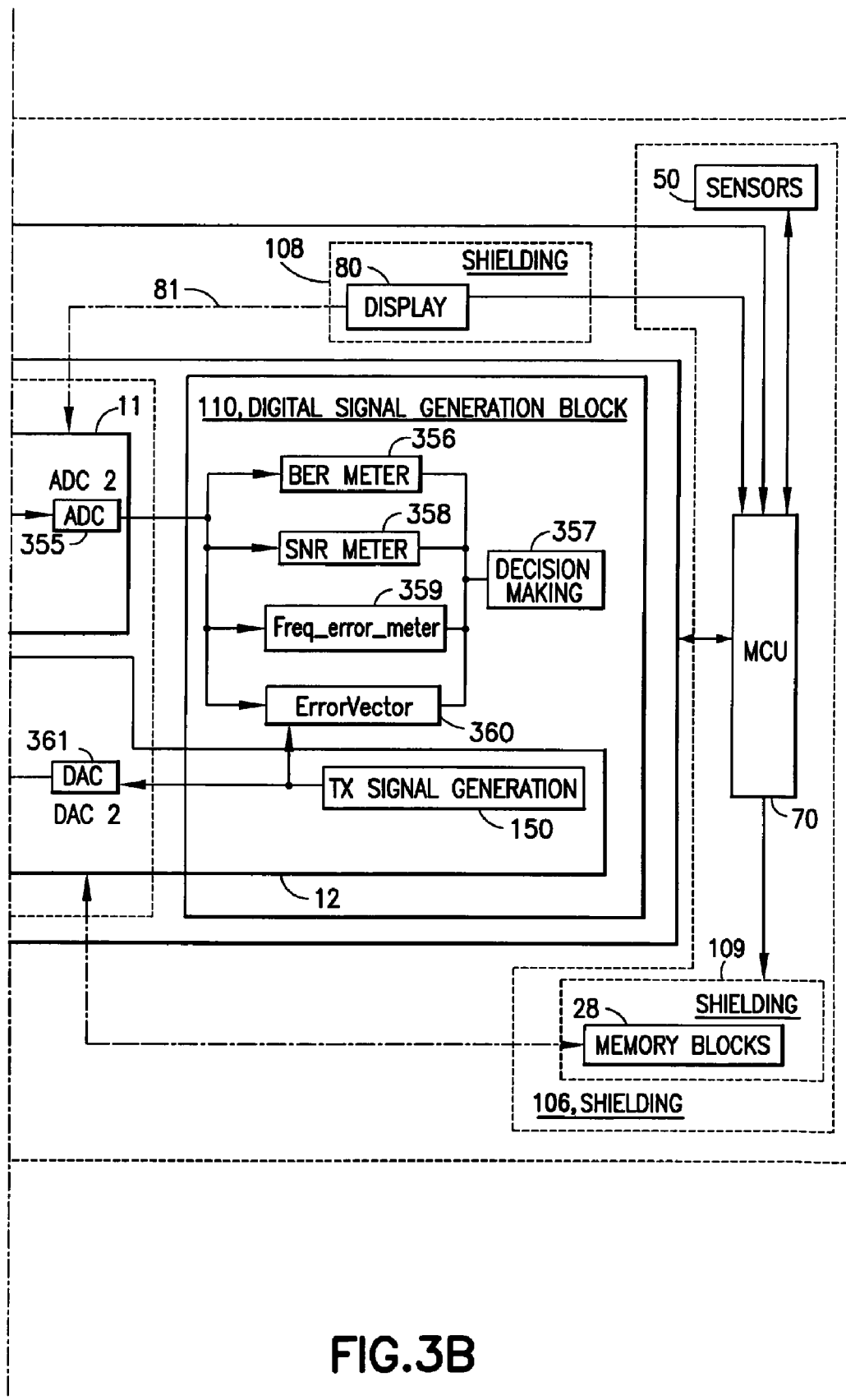

FIG. 3 illustrates an exemplary embodiment of the invention as applied in a first radio, shown as a block 300. The first radio is an FDD transmitter and receiver. The frequency domain division TX and RX illustrated in FIG. 3 are operating at a same time at different frequencies. Thus, the FDD transmitter and receiver are utilizing separate VCOs. Further, FIG. 3 illustrates a superheterodyne transmitter and receiver since at least one intermediate frequency is used between baseband and radio frequency. As illustrated in FIG. 3 a separate shielding for radio transceiver 300 radio parts can be provided with a shielding 104.

In addition, according to a non-limiting embodiment of the invention it can be noted that devices in the FIG. 3 are numbered for reference purposes. It can be seen that as a non-limiting embodiment of the invention there is illustrated in FIG. 3 LNA1 350, mixer3 351, IF Filter 352, mixer5 353, LPF2 354, ADC2 355, BER meter 356, decision making unit 357, SNRmeter 358, freq_error_meter 359, errorvector unit 360, DAC2 361, LPF3 362, mixer6 363, TX oscillator2 364, RX oscillator2 365, RX VCO1 366, TX VCO1 367, IF filter1 368, mixer4 369, power amplifier1 370, duplexer1 371, test point 120, antenna1 168, and antenna node 135. Further a main control unit MCU 70, display 80, display shielding 108, sensors 50, memory blocks 28, shielding 109, $2^{nd}$ radio 60, antenna 62, and antenna node 68. In accordance with a non-limiting exemplary embodiment of the invention the MCU 70 can control, for example, a first radio 300 operation and/or the MCU 70 can control the digital signal generation block 110. In addition, the MCU 70 can run a protocol stack of the communication system to control and/or make active a receiver and transmitter at a time when a reception and/or a transmission occur.

Further, in accordance with a non-limiting embodiment of the invention as illustrated in a FIG. 3 a second radio unit 60 is shown. The second radio unit 60 can be a receiver, a transmitter or a transceiver. In accordance with a non-limiting embodiment of the invention the second radio unit 60 can be connected physically and/or logically to the same main control unit 70. In addition, the second radio 60 can be provided a separate shielding 107. Further, according to an exemplary embodiment of the invention the connection and a signaling between a first and a second radio and main control unit can include any of the following: an operational frequency of the transmission or reception of a first radio, an operational frequency of the transmission and/or reception of a second radio, power level(s) of a transmitted signal(s), power level(s) of a received signal(s), used modulation methods, harmonic frequencies generated by radio blocks, harmonic power level generated from a radio block, timings of the receptions and transmissions of a radios, a number of sub-carriers of a reception or transmission, operational temperature of the device, ambient temperature of device, operational mode of device, and data rates of a signals or an expected interference signal level.

Further, in accordance with an embodiment of the invention the MCU 70 can detect a possible interference scenario from this signaling between radios and a main control unit. In addition, the MCU 70 is configurable to activate a shielding test if an interference scenario is detected. In addition, as illustrated in FIG. 3 memory blocks 28 can be coupled to the MCU 70. A separate shield 109 may be provided for a memory block 28. The main control unit 70 is configurable to detect an operational frequency of a communication between memories and a communication signal level. This information can be alternatively used as interference scenario detection and/or used as a basis to activate a shielding testing or assessment procedure according to an embodiment of the invention. Further, in conformance with an operation a method and apparatus as described herein an interference scenario, according to an exemplary embodiment of the invention, is a computational scenario in which operational frequencies such as communication bus frequencies, clock frequency multiples, harmonic frequencies transmission and reception frequencies can be presented at predetermined times.

In accordance with a non-limiting exemplary embodiment of the invention as illustrated in a FIG. 3 there is a sensors block 50. It is noted that the sensors block 50 is not limited to only sensors described in this specification. Further, it is noted that sensors block 50 can be implemented in any device as described herein and in accordance with any embodiments of the invention. In accordance with another non-limiting exemplary embodiment of the invention a qualification test method may be performed when triggered or actuated directly or indirectly by any of the sensors which can make up the sensors 50. It is further noted that sensors 50 can be integrated into a radio frequency communication device, in accordance with a non-limiting embodiment of the invention, to detect a change in the operational and/or physical condition of the device. For example, a shielding test may be performed when a moisture sensor has detected increased moisture outside or inside of the device and/or if a temperature sensor has detected increased temperature outside or inside of the device. In addition, a test may be needed to be performed if it is determined that different mechanical shielding implementations have different moisture and temperature behavioral characteristics.

In an exemplary embodiment of the invention testing can be performed when an accelerator sensor detects that a device may have been dropped for example and struck a floor. Momentary deformation resulting from an impact of such a drop for example can cause damage to shielding and as such any shield damage can be detectable with the performed test according to embodiments of the invention. In addition, in a non-limiting exemplary embodiment of the invention an assessment or a test result can be stored to a terminal memory along with other information. Such information, for example, can include test result(s), time stamp(s), accelerator sensor information, duration and direction or any other related information. Further, information which can be stored to a memory can include for example why a shielding testing or assessment has been conducted. Further in accordance with an embodiment of the invention shield testing can be performed when a terminal has dropped a connection during a communication.

Further, according to the embodiments of the invention information in addition to test results which can be stored to a memory of a device include communication system parameters. It is noted that the communication parameters may be, for example, a transmission power, a transmission frequency, a transmission data rate, a transmission modulation, a number of sub-carriers of a transmission, example a reception power, a reception signal quality, a reception frequency, a reception data rate, a reception modulation, a number of sub-carriers of a reception, a temperature of a device, an ambient temperature of a device, other active sub-systems of a device, other active radio sub-systems of a device, communication parameters of other active radio subsystems. Further, the stored information can include device operational parameters such as an operational mode of a device such as an open or closed position of a device, peripherals connected to a device, a status and activity of the connected peripherals, names, and a status of active software applications of a device. Further, according to the embodiments of the invention the terminal is configurable to indicate a test result to the user. The test result can be communicated for example but not limited via a UI such as a speaker with a voice, and/or as a text at a display, and/or by sending a message to, for example, a network. A test result can be routed from a network 654 to at least one of a service center, a manufacturer of a device, an operator of a network or a radio spectrum coordinator a shown in FIG. 6. In alternative embodiment of the invention a shielding test can be performed in conjunction with a communication between a device and a network or with a communication between a device and a device.

In another exemplary embodiment of the invention testing is performed when an operational mode of the device is activated. This operational mode may be indicated, as an example, by an opening of a mobile device and/or by sliding a protective cover or a display on the mobile device. Further, in accordance with the embodiments of the invention testing may be performed when the operational condition of the wireless system is changed. As an example the testing may be performed when a communication system changes either reception and/or transmission parameters. In addition, the testing may be performed when the operational condition of another wireless system is changed. As an example testing may be performed when a second communication system is activated or when the second communication system changes reception and/or transmission parameters. In another exemplary embodiment of the invention a testing is performed when an oscillation problem is expected, which generates an unwanted frequencies. A second receiver monitors frequencies where an oscillation frequency is expected to be present. This oscillation can be originated inside a shielding, when a lid of a shield can is not at a correct height. Alternatively a oscillation may be originated between at least two shielding blocks if an intermediate wall between blocks is not properly at place.

In another exemplary embodiment of the invention a wireless modem device for example a WWAN (Wireless Wide Area Network), a WLAN, a Wimax card or a UWB modem card, which can be assembled, inserted or connected into a device such as a laptop, is tested for interferences. In accordance with a non-limiting embodiment of the invention the interferences tested for can be generated, using the laptop as an example, from laptop computer blocks, processors, displays, cameras, power management, other radios in the laptop, clocks, fans or other blocks in the laptop computer environment. In a further non-limiting exemplary embodiment of the invention a wireless modem device and/or a laptop can communicate with each other. In accordance with an embodiment of the invention the communication can comprise information including the following: an operational frequency of the transmission or reception of a first radio, an operational frequency of the transmission or reception of a second radio, a power level(s) of a transmitted signal(s), a power level of a received signal, used modulation methods, harmonic frequencies generated by radio blocks, harmonic power level generated from a radio block, timings of the receptions and transmissions of a radios, a number of sub-carriers of a reception or transmission, operational temperature of the device, ambient temperature of device, operational mode of device, data rates of a signal and/or an expected interference signal level. In an embodiment of the invention a laptop display and other user interfaces, such as for example a speaker producing a sound, can be used indicating a test result or assessment for a user.

As illustrated in FIG. 3, there are interference signals 64 and 65 from a second radio 60. The interference signal 65 is radiated from a second antenna 60 and it may propagate to, for example, a shield 105. In addition, an interference signal 64 may be radiated from a second radio 60, for example, to a shielding 105. Also illustrated in FIG. 3 on the second radio 60 there is a separate shielding 107 and an antenna node 68 for a second antenna 62 of the second antenna 60.

In addition, it is noted that a second radio 60, according to a non-limiting embodiment of the invention, can generate a known predetermined signal operating at predefined frequency and a first receiver path 11 on a first radio 300 can detect and measure a pre-defined signal quality.

Further, in a non-limiting embodiment of the invention as illustrated in FIG. 3 there is a display block 80. The display block 80 can generate an interference signal 81 which is proportional to operational frequencies used in the display. The operational frequencies can be for example a display update frequency, a data rate of the signals between display and main control unit, a data rate of the clock signal between display and a main control unit. A separate shield 108 may be provided for a display block 80. In an embodiment of the invention a display block 80 can be any electrical peripheral unit in the device such as, for example, a vibration device, an integrated hands free speaker, a speaker, a microphone, a camera, and/or a flash light for camera for example.

Figure 4:
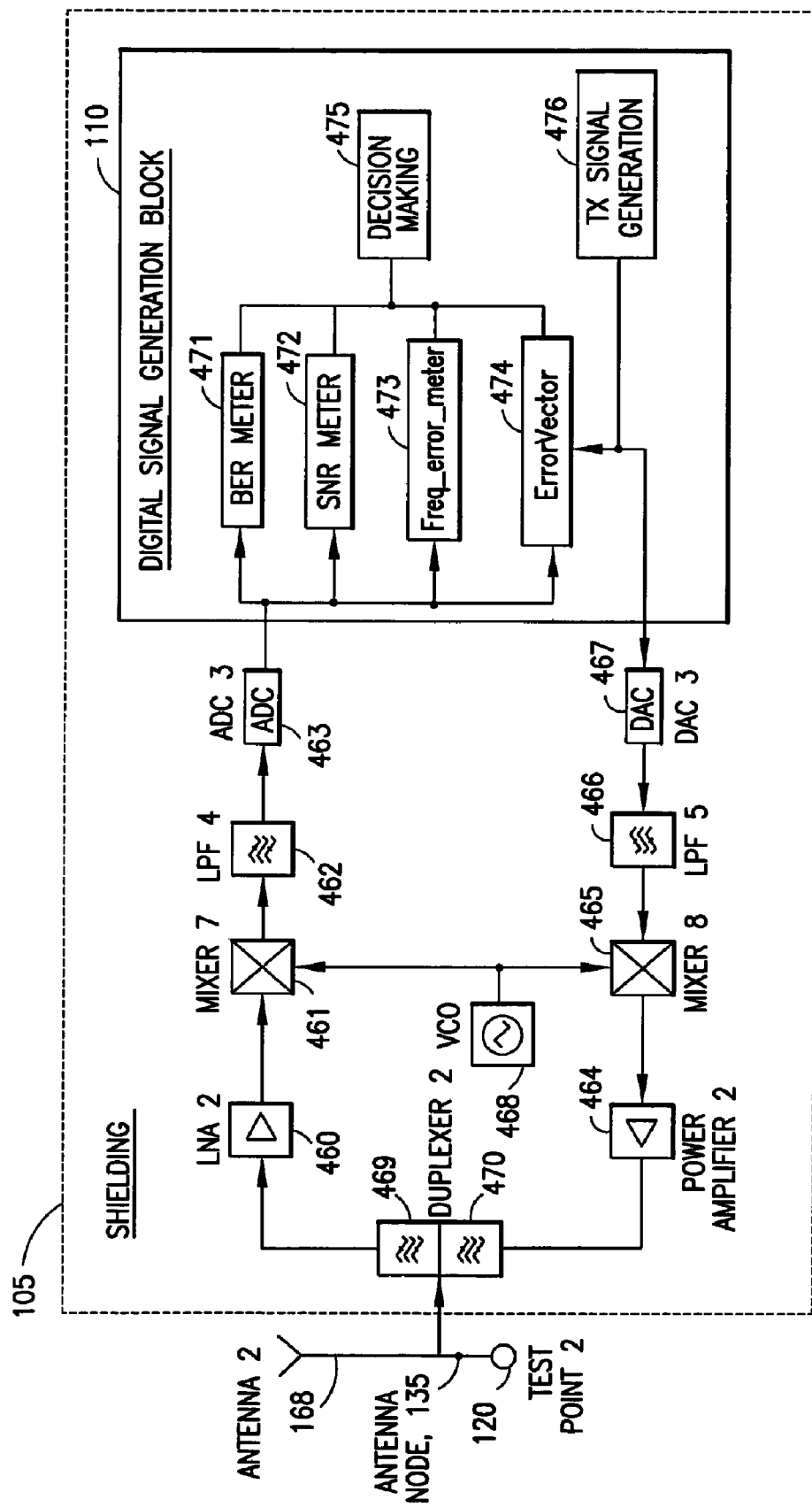
FIG. 4 illustrates a direct conversion TDD transmitter and receiver according to an exemplary embodiment of the invention.

In FIG. 4 there is illustrated an exemplary embodiment of the invention as applied in a TDD transmitter and receiver, wherein the time domain division TX and RX are operating at different times. It is noted that the transmission and reception frequencies can be different or the same frequency for both operations. As illustrated in FIG. 4 architecture one VCO 468 is shown. It is noted that in FIG. 4 the VCO 468 is shared for TX and RX operation, however if the TX and the RX are at the different frequencies the VCO frequency is altering between TX and RX time slots.

In addition, as a non-limiting embodiment of the invention there is illustrated for reference in FIG. 4 shielding 105, digital signal generation block 110, LNA2 460, mixer7 461, LPF4 Filter 462, ADC3 463, power amplifier2 464, mixer8 465, LPF5 466, DAC3 467, BER meter 471, decision making unit 475, SNRmeter 472, freq_error_meter 473, errorvector unit 474, VCO 468, TX signal generation unit 476, duplexer2 469 and 470, test point2 120, antenna2 168, and antenna node 135.

Further, in accordance with non-limiting embodiments of the invention it is noted that during transmission slot switches are configurable to be open and provide isolation of about 50 dB between the transmitter and the receiver. In addition, the receiver filters such as LPF4 462 are configurable to attenuate the transmitted signal frequency to for example 30 dB. In another non-limiting embodiment of the invention a transmission signal level, from for example the TX signal generation unit 476, is for an LB TX +33 dBm and for HB TX is +30 dBm. Further, an input signal level of a receiver input for its own transmitter signal is configurable to be low band (LB) −47 dBm and high band (HB) −50 dBm. In addition, it is noted that GSM low band frequencies can be 850 MHz, 900 MHz and GSM high band frequencies can be 1800 MHz, 1900 MHz.

In a non-limiting embodiment of a method and apparatus according to the invention a TX voltage control oscillator (VCO) of a transceiver is configurable to be set to a desired or predetermined frequency. In accordance with an exemplary embodiment of the invention the TX VCO signal, such as at VCO 468 in FIG. 4 for example, can be used for a TX carrier signal in the transmitter and in addition the TX VCO signal can be used for a down conversion of the generated TX carrier signal that is concurrently passed to or received in the receiver. Further in accordance with an exemplary embodiment of the invention controls and/or routing are configurable for use of a same VCO signal for the RX and the TX in the same transceiver and further configurable so that the same VCO signal are not in the same time.

In another non-limiting exemplary embodiment of the invention a VCO signal is configurable to be used for RX and TX of a transceiver in a same frequency and the controls and routing as described are further configurable at least in part using changes made by a digital signal generation block. Actual control signal to a VCO are not shown for clarity of the figure. In addition, in accordance with a non-limiting exemplary embodiment of the invention the receiver is configurable such that a down conversion of a received or passed signal can be done with a VCO output signal and I and Q signals, such as of a baseband signal, can be converted to digital format.

Figure 5:
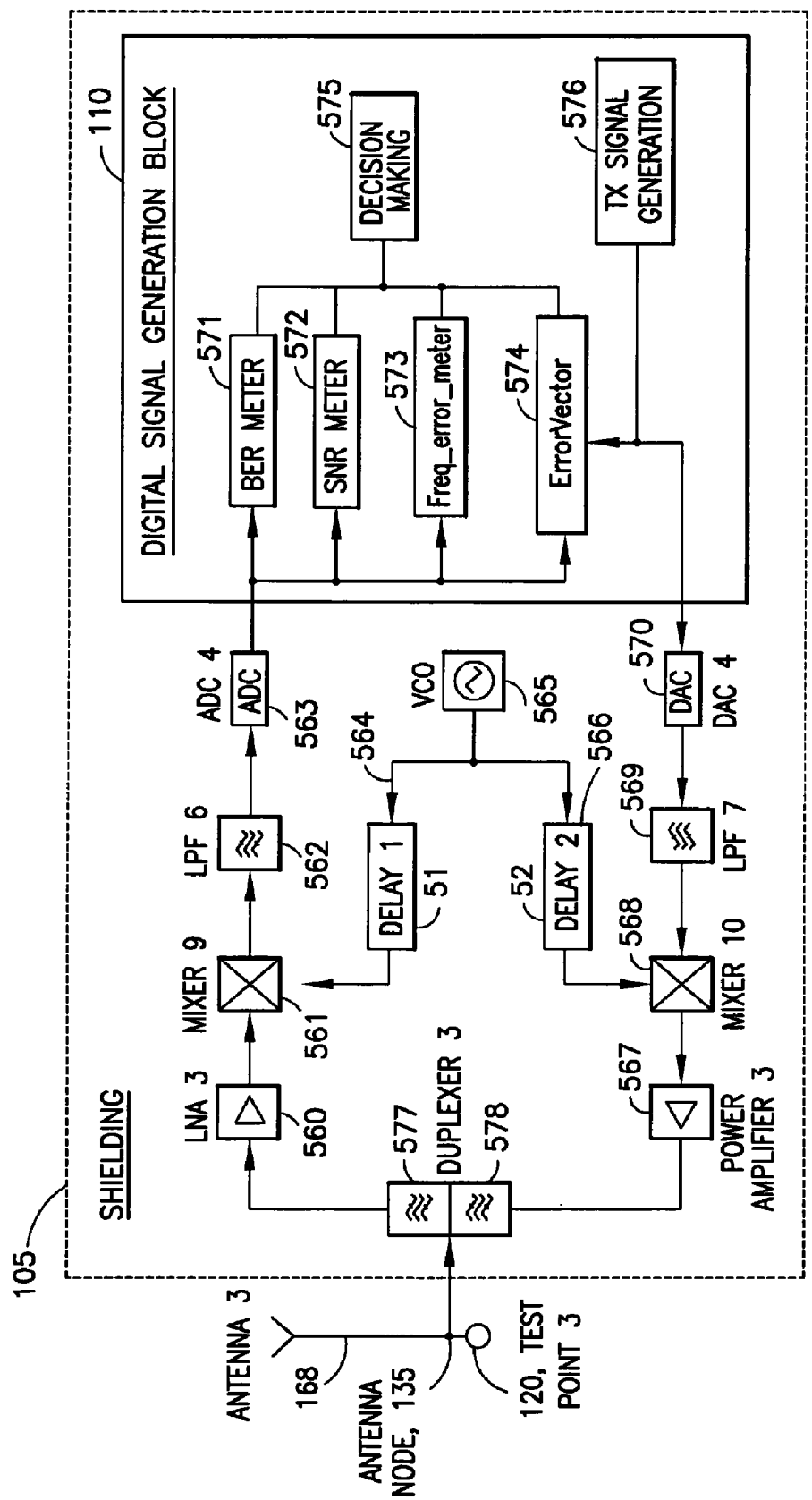
FIG. 5 illustrates a direct conversion TDD transmitter and receiver using delay elements in the VCO output according to an exemplary embodiment of the invention.

In FIG. 5 there is illustrated an exemplary embodiment of the invention as applied in a TDD transmitter and receiver, wherein the time domain division TX and RX are operating at different times. Thus, the transmission and reception frequencies can be different or the same frequency for both operations. In the TDD illustrated in FIG. 5 architecture with one VCO is shown. The VCO is shared for TX and RX operations. Further, as illustrated in FIG. 5 if the TX and the RX are at the different frequencies the VCO frequency is altered between TX and RX time slots. In FIG. 5 a direct conversion transceiver (transmitter and receiver) is shown, since only one frequency conversion is done. As illustrated in FIG. 5 there are shown delay elements 51 and 52 in the VCO output. A delay of a delay element can be altered with a control signal, which is not presented for clarity in FIG. 5. These delay elements can delay the VCO frequency equal to a change in the phase of the VCO output frequency. This change makes the receiver path more sensitive for external interference and thus in accordance with the embodiments of the invention a lower interference effect can be measured which equals a higher shielding measurement dynamic range.

As illustrated for reference in the TDD transmitter and receiver in FIG. 5 it can be seen that there is a shielding 105, digital signal generation block 110, LNA3 560, mixer9 561, LPF6 562, ADC4 563, power amplifier3 567, mixer10 568, LPF7 569, DAC4 570, BER meter 571, decision making unit 575, SNRmeter 572, freq_error_meter 573, errorvector unit 574, VCO 565, delay1 564, delay2 566, TX signal generation unit 576, duplexer3 577 and 578, test point3 120, antenna3 168, and antenna node 135. A shielding 105 is illustrated covering all operational blocks in FIG. 5. A shield mentioned in the text can contain at least one functional block or a one functional block can be shielded by a multiple shields as shown in FIG. 3.

In accordance with a non-limiting exemplary embodiment of the invention when a shielding test according to an embodiment of the invention is carried out then a receiver and transmitter are activated to operate at the same time. This enables a known interference generation from a transmitter that can be detected with a receiver. Further, in accordance with an exemplary embodiment of the invention in a typical GSM operation such as a TDD, which is described in a GSM standard as a B-class operation, the operational mode is changed so that a receiver and transmitter are operating at the same time, which is described in a GSM standard as a A-class operation.

Figure 6:
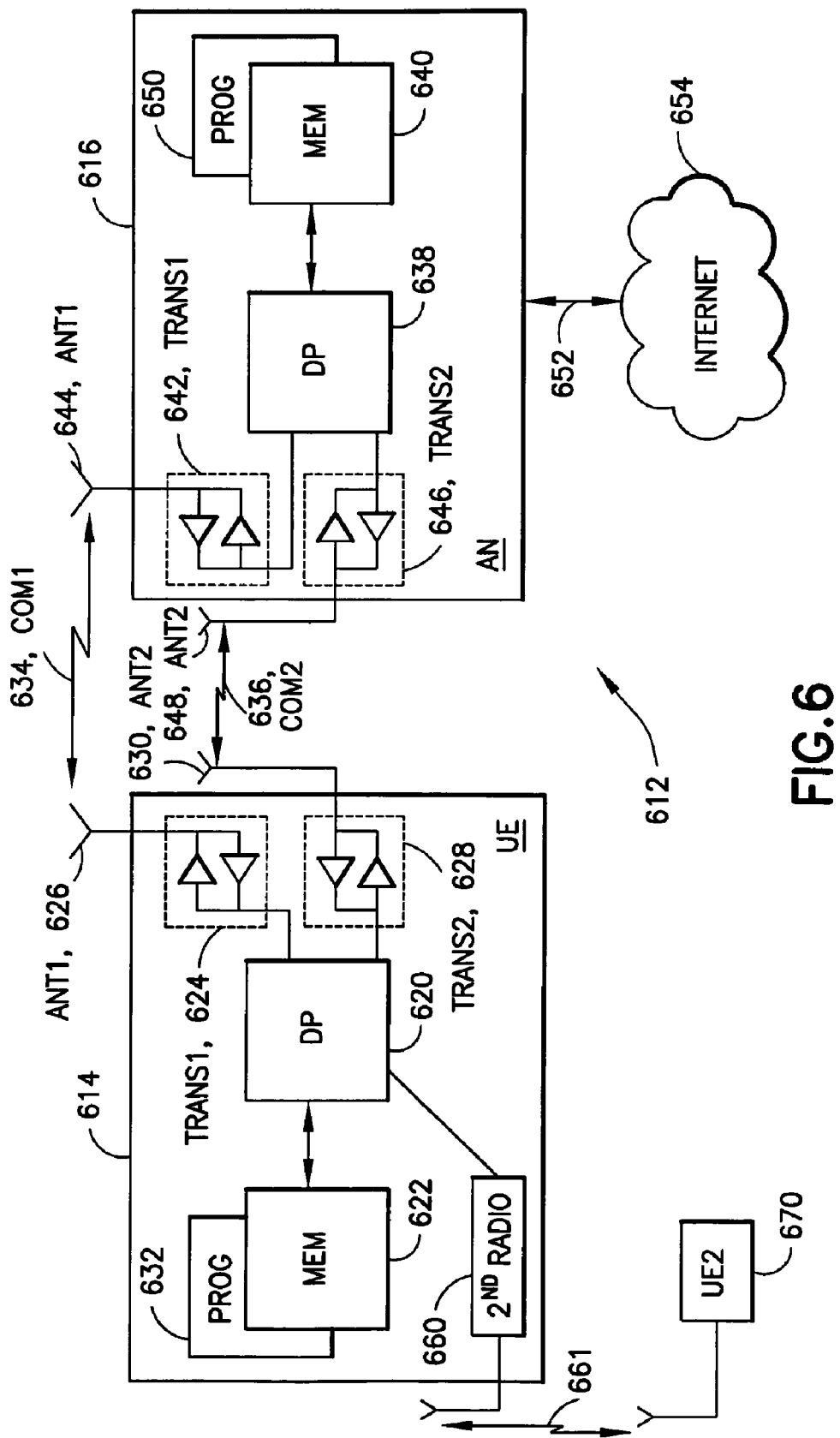
FIG. 6 illustrates a simplified block diagram of various electronic devices that are suitable for use in practicing the exemplary embodiments of the invention.

Reference is made to FIG. 6 for illustrating a simplified block diagram of various electronic devices that are suitable for use in practicing the exemplary embodiments of this invention. In FIG. 6, a wireless network 612 is adapted for communication with a user equipment (UE) 614 via an access node (AN) 616.

The UE 614 includes: a data processor (DP) 620; a memory (MEM) 622 coupled to the DP 620; a suitable first RF transceiver (TRANS1) 624 (it is understood that the UE 614 can have a separate transmitter (TX) and a separate receiver (RX) or can have a transceiver) coupled to the DP 620; a first antenna (ANT1) 626 coupled to the TRANS1 624; a suitable second RF transceiver (TRANS2) 628 (having a transmitter (TX) and a receiver (RX)) coupled to the DP 620; and a second antenna (ANT2) 630 coupled to the TRANS2 628. The MEM 622 stores a program (PROG) 632. The TRANS1 624 and TRANS2 628 are both capable of bidirectional wireless communication, such as a first communication (COM1) 634 and a second communication (COM2) 636, with the AN 616.

Additionally a UE 614 can include a $2^{nd}$ radio which is primarily used for communication between user equipments such as UE2 670. Such a $2^{nd}$ radio 660 is shown in FIG. 6. Further, in FIG. 6 a signaling method 661 in accordance with the embodiments of the invention is illustrated between the $2^{nd}$ radio 660 and the user equipments UE2 670. The user equipment UE2 670 may be similar to a UE 614 or it can be a dedicated device to support a signaling method 661 in accordance with the embodiments of the invention. Further, although not illustrated it is understood that the UE2 670 can include any or some of the components devices as illustrated for the UE 614 and/or functionalities of any devices or components described herein. As a further non-limiting embodiment of the invention, for example, a signaling method 661 can communicate via Bluetooth™ which primarily used as a wireless cable replacement.

In FIG. 6 AN 616 includes: a data processor (DP) 638; a memory (MEM) 640 coupled to the DP 638; a suitable first RF transceiver (TRANS1) 642 (having a transmitter (TX) and a receiver (RX)) coupled to the DP 638; a first antenna (ANT1) 644 coupled to the TRANS1 642; a suitable second RF transceiver (TRANS2) 646 (having a transmitter (TX) and a receiver (RX)) coupled to the DP 638; and a second antenna (ANT2) 648 coupled to the TRANS2 646. The MEM 640 stores a program (PROG) 650. The TRANS1 642 and the TRANS2 646 are both capable of bidirectional wireless communication, such as the COM1 634 and the COM2 636, with the UE 614. The AN 616 may be coupled via a data path 652 to one or more external networks or systems, such as the internet 654, for example.

Further, although not illustrated in FIG. 6, the AN 616 can be configured to generate, transmit, and/or receive a signal method such as but not limited to a signaling method 661 in accordance with an exemplary embodiment of the invention.

In some exemplary embodiments, but not limited by illustration, the transceivers 624, 628, 642, 646 and antennas 626, 630, 644, 648 of the UE 614, the UE2 670 and AN 616 may be utilized for MIMO communications via COM1 634 and COM2 636.

At least one of the PROGs 632, 650 is assumed to include program instructions that, when executed by the associated DP, enable the electronic device to operate in accordance with the exemplary embodiments of this invention, as discussed herein.

In general, the various embodiments of the UE2 670 and the UE 614 can include, but are not limited to, cellular phones, personal digital assistants (PDAs) having wireless communication capabilities, portable computers having wireless communication capabilities including assembled or connected WWAN modems, wireless data modems, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The embodiments of this invention may be implemented by computer software executable by one or more of the DPs 620, 638 of the UE 614, the UE2 670, and the AN 616, or by hardware, or by a combination of software and hardware.

The MEMs 622, 640 may be of any type suitable to the local technical environment and may be implemented using any suitable data storage technology, such as semiconductor-based memory devices, magnetic memory devices and systems, optical memory devices and systems, fixed memory and removable memory, as non-limiting examples. The digital processors 620, 638 may be of any type suitable to the local technical environment, and may include one or more of general purpose computers, special purpose computers, microprocessors, digital signal processors (DSPs) and processors based on a multi-core processor architecture, as non-limiting examples.

Although shown in FIG. 6 as having two transmitters, two receivers, and two antennas, the UE 614, the UE2 670, and/or the AN 616 may comprise a different number of transceivers and/or antennas or may comprise a different number of transmitters, a different number of receivers, and/or a different number of antennas. As a further non-limiting example the UE 614, the UE2 670 and/or the AN 616 may each comprise one transmitter, one receiver, and one antenna.

The embodiments of this invention may be implemented by computer software executable by a data processor of the UE 614, such as the DP 620, or by hardware circuitry, or by a combination of software and hardware circuitry. Further in this regard it should be noted that the various blocks of the logic flow diagram of FIG. 6 may represent program steps, or interconnected logic circuits, blocks and functions, or a combination of program steps and logic circuits, blocks and functions for performing the specified tasks.

Figure 7:
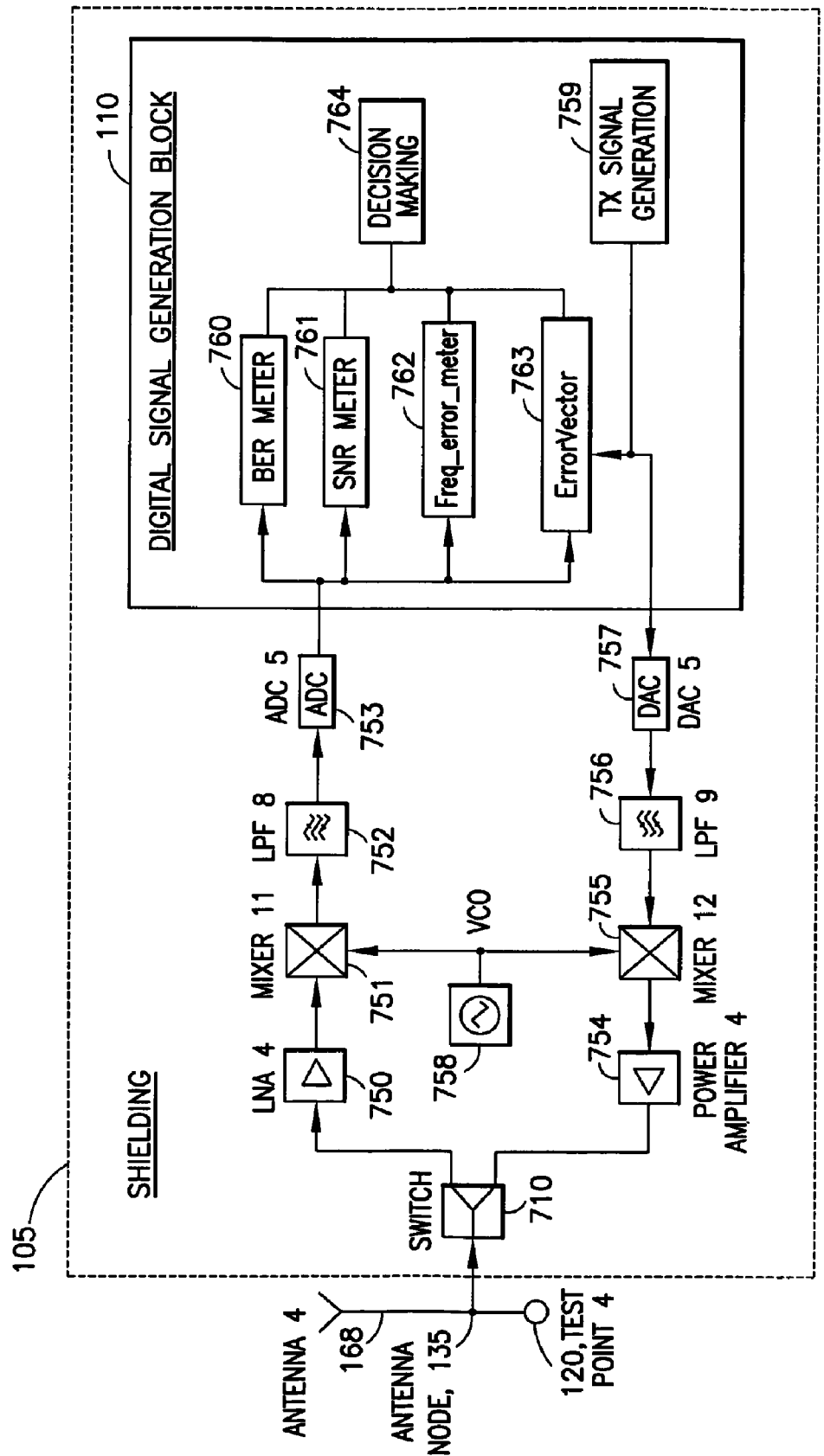
FIG. 7 illustrates a direct conversion TDD transmitter and receiver using a switch to connect either the TX or RX to an antenna according to an exemplary embodiment of the invention.

FIG. 7 illustrates yet another variation of a TDD transmitter and receiver wherein the exemplary embodiments of the invention are applied. As previously stated in the TDD the transmission and reception frequencies can be different or the same frequency for both operations. In FIG. 7 is illustrated a TDD architecture with one VCO that is shared for TX and RX operation. In the TDD as illustrated if TX and RX are at different frequencies a VCO frequency is altered between the TX and RX time slots. Further in FIG. 7 a direct conversion transceiver (transmitter and receiver) is noted since only one frequency conversion is done. It is noted that in the TDD as illustrated in FIG. 7 in accordance with an embodiment of the invention an alternative method to combine TX and RX branches to the antenna is to use a switch 710 which connects either TX or RX path to the antenna.

As illustrated in FIG. 7 there is a shielding 105, a digital signal generation block 110, LNA4 750, mixer11 751, LPF8 752, ADC5 753, power amplifier4 754, mixer12 755, LPF9 756, DAC5 757, BER meter 760, decision making unit 764, SNRmeter 761, freq_error_meter 762, errorvector unit 763, VCO 758, TX signal generation unit 759, switch 710, test point4 120, antenna4 168, and antenna node 135.

Figure 8:
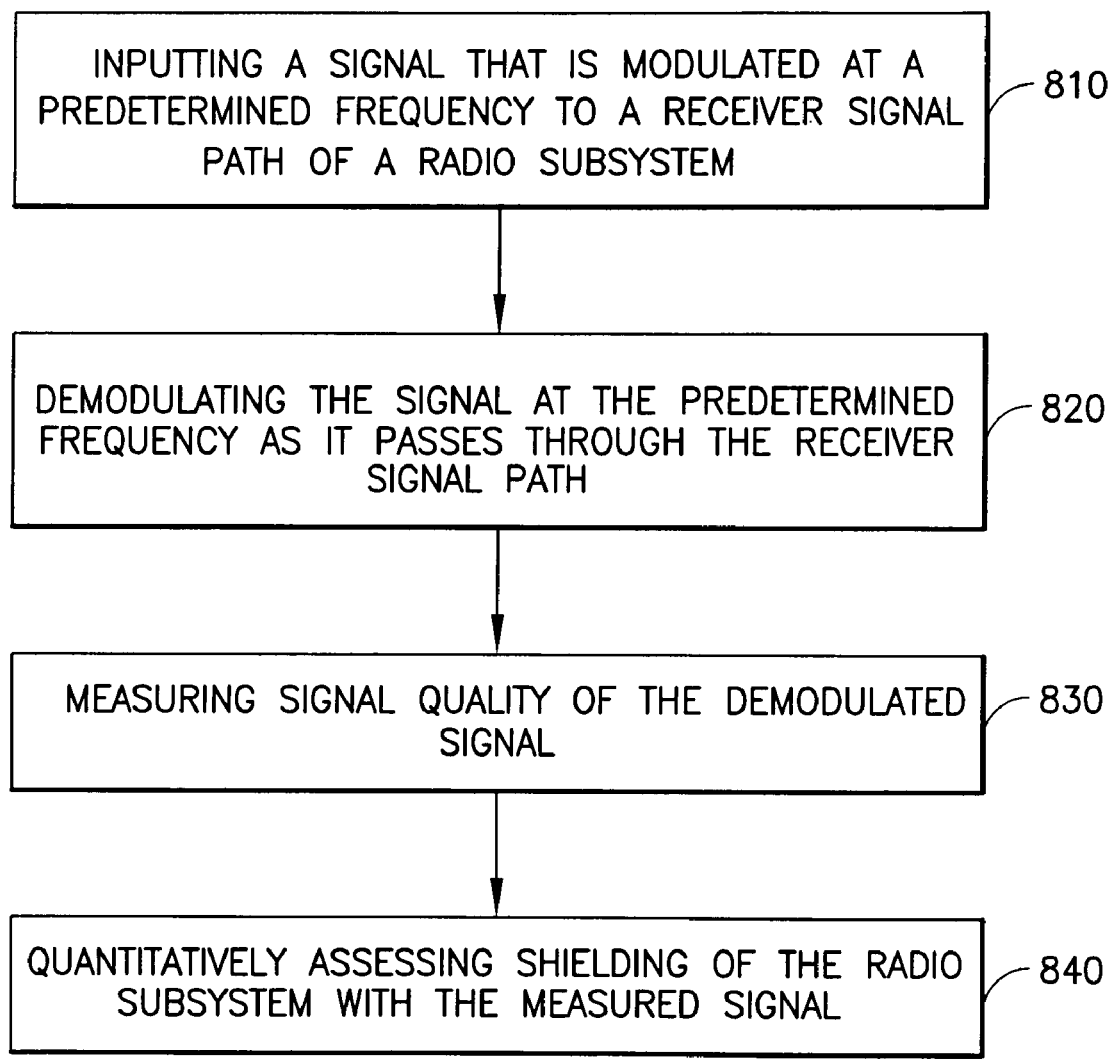
FIG. 8 is a logic flow diagram that is illustrative of a method in accordance with an exemplary embodiment of the invention.

FIG. 8 illustrates in a logic flow block diagram of a method according to an exemplary embodiment of the invention. In FIG. 8 there is illustrated steps of 810 inputting a signal that is modulated at a predetermined frequency to a receiver signal path of a radio subsystem and 820 demodulating the signal at the predetermined frequency as it passes through the receiver signal path, 830 measuring signal quality of the demodulated signal, and 840 quantitatively assessing shielding of the radio subsystem with the measured signal. It is noted that a step 810 may include to active a receiver and a transmitter at the same time.

Figure 9:
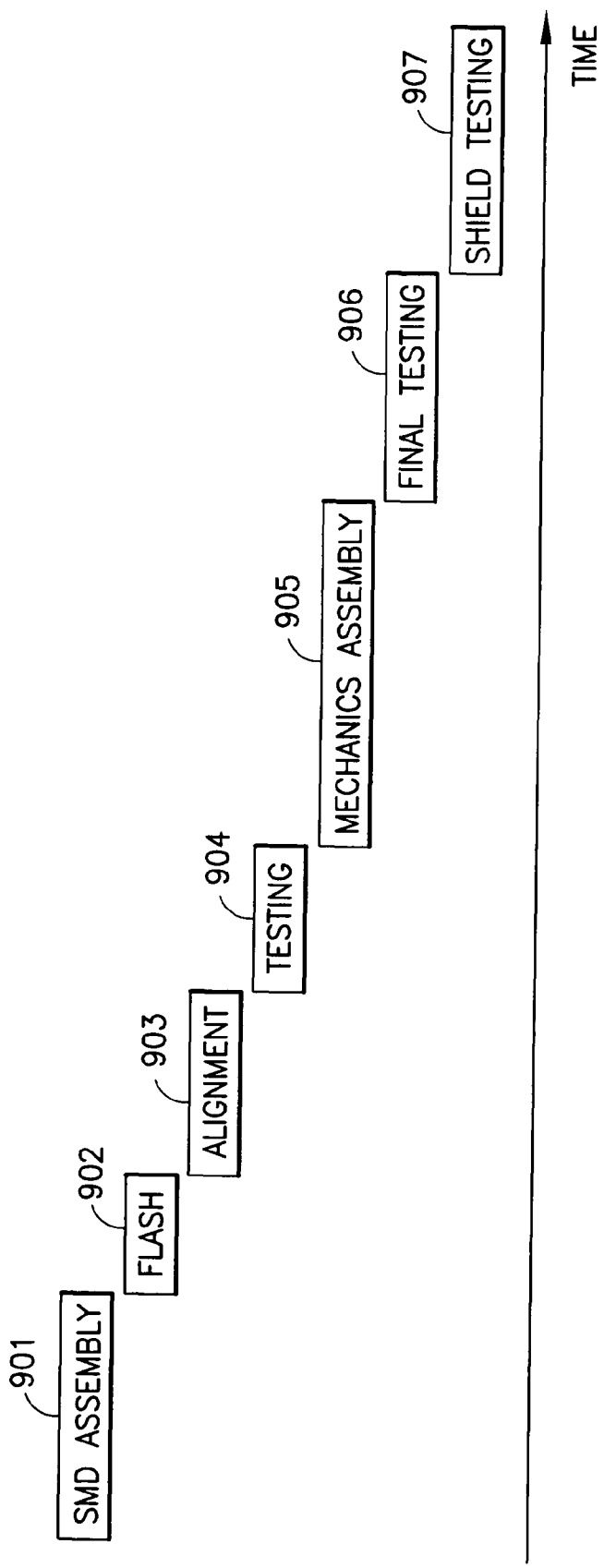
FIG. 9 is a flow diagram that is illustrative of a production line method.

FIG. 9 illustrates a production flow diagram. In a first phase such as SMD assembly 901 there is accomplished soldering and a pasta print onto a PWB surface. In SMD assembly 901 pre-defined components are assembled onto PWB. It is noted that component assembly may contain shielding cans and/or other parts, which reduce interference, such as filtering components. After assembly a PWB is routed thru an SMD oven for a predefined time and temperature profile. After the SMD oven any components and shields cans are attached to PWB. In a pasta print enough heat during heat flow and coplanar shield parts are essential for RF shielding efficiency and successful mass production. SMD quality can be followed with a sample based visual inspection or the like. In a testing phase there first can be a flashing 902 and then BB and RF self-tests and/or alignment 903. After tuning can be predefined testing sequences 904 to qualify tunings and all components existence. Generally tunings are done with galvanic connections with predefined test points on the PWB. Further, in this phase it is possible to execute shielding quality related testing and/or store test results to a terminal/device memory or production line mass memory for later use of the results. These results can be utilized in later phase such as in final testing 906 after a mechanics assembly 905, in service centers and/or during normal operation.

It is noted that some products are not needed to be mechanics assembled. These products may include WWAN modules which are used inside laptop computers for example. WWAN modules can be shipped to laptop assembly facilities or after sales assembly facilities. However, it is noted that generally user devices have mechanic assembly for user equipment electromechanical parts such as displays, antennas, microphones, earpieces, cameras and other parts that are integrated into the device and/or the device cover.

Further, as illustrated in FIG. 9, after mechanics assembly 905 a unit is final tested 906 to ensure that all parts are assembled and all functionalities exist and antennas are present. In this phase shielding testing 907 in accordance with an embodiment of the invention may be also tested. It can be understood that there are significant possibilities for error during manufacturing. Further, these possible errors can result in damaged shielding efficiency. For example, in an assembly phase shield lids can be bent, screw movements may inadvertently cause damage, a gasket can become damaged during assembly, some parts may dislodge causing failed units, and a shielding contact can produce errors or failure due to a poor soldering point on a PWB. In addition, there could be some essential details missing from pre-assembled parts which may impact interference scenarios, like via(s) missing between layers in PWB or modules, too thin a layer of shielding paint or shielding paint missing.

In accordance with the exemplary embodiments of the invention interference testing can be accomplished with external testers and couplers/antennas or methods presented in this patent application. In service centers terminal may be advantageous tested before assembly and/or disassembly.

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on-a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Further, the term "coupled" as used herein is not intended to be limited to a direct connection between recited components, but encompasses a disposition wherein there may be one or more intervening components or elements between the recited ones.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method, comprising:
    inputting a signal, from a transmitter of a radio subsystem, that is modulated at a predetermined frequency to a receiver signal path of a receiver of the radio subsystem;
    demodulating the signal at the predetermined frequency as the signal passes through the receiver signal path;
    measuring signal quality of the demodulated signal; and
    assessing shielding efficiency of the radio subsystem with the measured signal quality.

2. The method of claim 1, where assessing further comprises comparing the measured signal quality to a predetermined threshold limit to determine a pass or fail condition for the shielding.

3. The method of claim 1, where inputting the signal further comprises generating the signal using selected bit sequences to optimize the assessment.

4. The method of claim 1, where inputting the signal further comprises generating a signal that is pre-distorted to enhance the signal quality measurement.

5. The method of claim 1, where inputting the signal further comprises modulating a generated signal with a transmitter oscillator and demodulating the signal comprises down converting the signal with the transmitter oscillator.

6. The method of claim 1, where inputting the signal further comprises generating the signal along a transmitter signal path of a same device in which the receiver signal path is located, and wherein generating the signal comprises amplifying the signal on the transmitter signal path before passing to the receiver signal path.

7. The method of claim 1, where the method is automatically initiated by a detection of a condition.

8. The method of claim 7, where the condition comprises at least one of an operational frequency of the transmission or reception of a first radio, an operational frequency of the transmission or reception of a second radio, a received signal power level, a signal modulation type of a received signal, a generated harmonic frequency, a generated harmonic power level, a timing of a reception or a transmission of a signal, a number of sub-carriers of a reception or transmission of a signal, a data rate of a received signal, an expected signal interference level, an operational temperature of a device, an ambient temperature of a device, an acceleration of a device, an impact of a device, and an operational mode of a device.

9. The method of claim 1, where the shielding of the radio subsystem is a combination of a shielding provided for the radio subsystem and a shielding of an interfering source.

10. The method of claim 1, where a result of the assessment of the shielding efficiency is stored in a memory of a device.

11. The method of claim 1, further comprising indicating the shielding efficiency assessment via a local user interface or via a network.

12. The method of claim 1, where the assessment of the shielding efficiency is performed with a configurable transmission output power.

13. A non-transitory computer readable medium encoded with a computer program executable by a processor to perform actions comprising:
  inputting a signal, from a transmitter of a radio subsystem, that is modulated at a predetermined frequency to a receiver signal path of a receiver of the radio subsystem;
  demodulating the signal at the predetermined frequency as the signal passes through the receiver signal path;
  measuring signal quality of the demodulated signal; and
  assessing shielding efficiency of the radio subsystem with the measured signal quality.

14. An apparatus, comprising:
  at least one data processor; and
  at least one memory including computer software, where the at least one memory and the computer software are configured, with the at least one data processor, to cause the apparatus to at least:
  input a signal, from a transmitter of a radio subsystem, that is modulated at a predetermined frequency to a receiver signal path of a receiver of the radio subsystem;
  demodulate the signal at the predetermined frequency as the signal passes through the receiver signal path;
  measure signal quality of the demodulated signal; and
  assess shielding efficiency of the radio subsystem with the measured signal quality.

15. The apparatus of claim 14, where the at least one memory including the computer software is configured, with the at least one data processor, to cause the apparatus to generate the signal using selected bit sequences to optimize the assessment.

16. The apparatus of claim 14, where the at least one memory including the computer software is configured, with the at least one data processor, to cause the apparatus to generate, a signal that is pre-distorted to enhance the signal quality measurement.

17. The apparatus of claim 14, where the at least one memory including the computer software is configured, with the at least one data processor, to cause the apparatus to modulate a generated signal with a transmitter oscillator and demodulate the signal comprising down converting the signal with the transmitter oscillator.

18. The apparatus of claim 14, where the at least one memory including the computer software is configured, with the at least one data processor, to cause the apparatus to generate the signal along a transmitter path of a same device in which the receiver signal path is located, and amplify the generated signal on the transmitter path before passing through the receiver signal path.

19. The apparatus of claim 14, where the at least one memory including the computer software is configured, with the at least one data processor, to cause the apparatus to compare the measured signal quality to a predetermined threshold limit to determine a pass or fail condition.

20. The apparatus of claim 14, where operations of the apparatus are automatically initiated by a detection of a condition.

21. The apparatus of claim 20, where the condition comprises at least one of an operational frequency of the transmission or reception of a first radio, an operational frequency of the transmission or reception of a second radio, a received signal power level, a modulation type of a received signal, a generated harmonic frequency, a generated harmonic power level, a timing of a reception or a transmission of a signal, a number of sub-carriers of a reception or transmission of a received signal, a data rate of a signal, an expected signal interference level, an operational temperature of a device, an ambient temperature of a device, an acceleration of a device, an impact of a device, and an operational mode of a device.

22. The apparatus of claim 14, where shielding of the apparatus is a combination of a shielding provided for the radio subsystem and a shielding of an interfering source.

23. The apparatus of claim 14, where the at least one memory including the computer software is configured, with the at least one data processor, to cause the apparatus to indicate the shielding efficiency assessment to a user of the apparatus via a local user interface or via a network.

24. The apparatus of claim 14 comprising a mobile device.

25. The apparatus of claim 14, further comprising the at least one memory including the computer software is configured, with the at least one data processor, to cause the apparatus to store a result of the assessment in a memory of the apparatus.

* * * * *